United States Patent [19]

Taki et al.

[11] 4,290,732
[45] Sep. 22, 1981

[54] APPARATUS FOR CARRYING AND PLACING COMPONENTS

[75] Inventors: Yasuo Taki, Hirakata; Shigeru Araki, Katano; Kazuhiro Mori, Katano; Yoshihiko Misawa, Katano; Souhei Tanaka, Hirakata, all of Japan

[73] Assignee: Matsushita Electric Industrial Co. Ltd., Kadoma, Japan

[21] Appl. No.: 72,850

[22] Filed: Sep. 6, 1979

[30] Foreign Application Priority Data

Sep. 8, 1978 [JP] Japan .................................. 53-111187

[51] Int. Cl.³ ........................ B65G 47/91; H01L 21/58
[52] U.S. Cl. ................................... 414/752; 294/64 R; 414/753
[58] Field of Search .................. 414/72, 74, 120, 121, 414/122, 751, 752, 753, 591; 294/2, 64 R, 65

[56] References Cited

U.S. PATENT DOCUMENTS

| | | | |
|---|---|---|---|
| 2,783,078 | 2/1957 | Billner | 294/65 |
| 3,651,957 | 3/1972 | Ball et al. | 294/64 R X |
| 4,135,630 | 1/1979 | Snyder et al. | 294/64 R X |

Primary Examiner—James L. Rowland
Attorney, Agent, or Firm—Wenderoth, Lind & Ponack

[57] ABSTRACT

An apparatus for carrying electronic components from a supply position to an electronic circuit board or the like and placing the electronic components on the electronic circuit board or the like, which has a rod provided at its tip end with a suction tool for picking up components to be carried and which is connected with an air suction apparatus; a body frame supporting the rod for movement of the rod in the vertical and horizontal directions; two pairs of position regulating pawls which are movably supported on the rod and are supported for freely opening and closing to grasp the components from different directions which the components are held by the suction tool and positioning them; and an arrangement for opening and closing the position regulating pawls.

4 Claims, 12 Drawing Figures

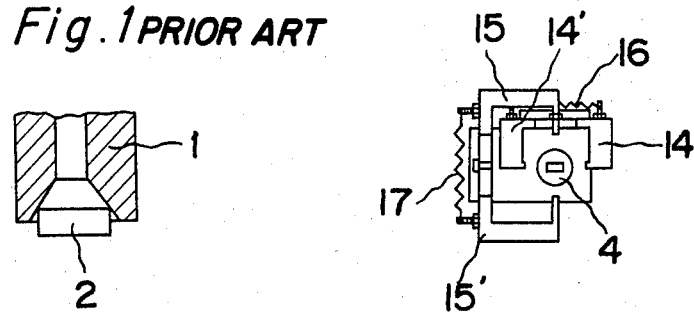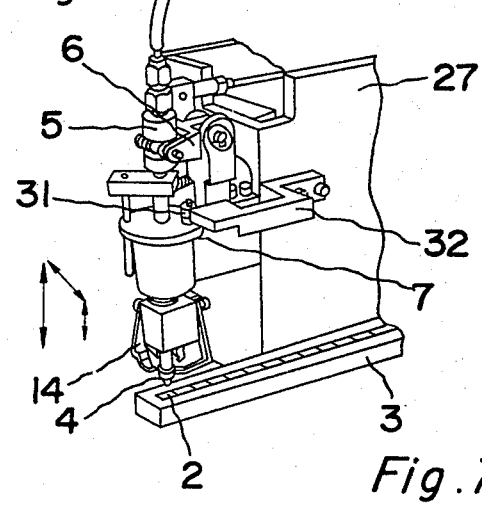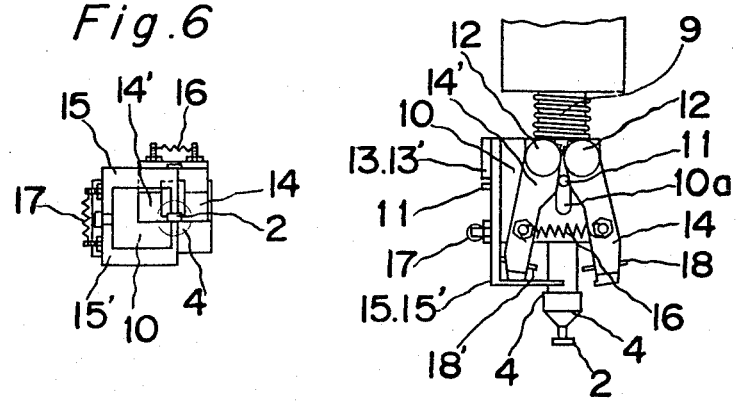

APPARATUS FOR CARRYING AND PLACING COMPONENTS

BACKGROUND OF THE INVENTION

The present invention relates to an apparatus for carrying electronic components and placing them on an electronic circuit board or the like.

Conventionally, to place electronic components, particularly microelectronic components (hereinafter referred to as tip components) of a leadless type onto the circuit board, there has been adopted a method of picking up a tip component with a vacuum type of suction tool, carrying it to a given position and placing it to engage the circuit board. However, problems are involved in the accuracy of engagement of the tip component with the circuit board due to the tip component slipping relative to the tool during the pick-up operation and during the carrying and placing operations. To prevent such slipping of the tip component, the shape of the tip of the suction tool 1 has been improved for better guidance of the tip component 2, for instance, by providing a wide-mouthed opening for the suction tool as shown in FIG. 1. However, this has disadvantages in that the tip component may be tilted in the opening or the tip end of the suction tool 1 comes into contact with the circuit board.

Another method involves providing a position regulating apparatus along the path of the tool to the position at which the tip component is to engage the board and placing the tip component on the position regulating apparatus and then again picking up the position regulated tip component and placing it at the given position on the board. According to this method, the accuracy of the position of the tip component is corrected by the position regulating apparatus, but time is wasted in regulating the position midway of the carrying and placing operations. In addition, a special position regulating apparatus is required, and in picking the tip component up again after the positional regulation, some slipping of the position is caused.

SUMMARY OF THE INVENTION

The present invention is provided to overcome the disadvantages of the conventional apparatus yet to regulate the position of the tip component while carrying and placing the tip component, and yet the present invention makes it possible to perform the carrying and placing of the tip components at a higher speed and with better positional accuracy on the printed circuit board or the like.

Furthermore, the present invention provides an apparatus for carrying and placing of tip components, wherein the functions of position regulating pawls which function for shortening the time needed for positioning of the tip component make it possible to detect the presence of the tip component during the carrying and placing operations, whereby the necessity for a conventional vacuum sensor or a photosensor of high quality is avoided.

According to the present invention, there is provided an apparatus for carrying and placing components which comprises a rod provided, at its tip end, with a suction tool for picking up components to be carried and having a vacuum apparatus connected to the suction tool; a body frame supporting said rod for movement of said rod in the vertical and horizontal directions; two pairs of position regulating pawls which are movably supported on said rod and are supported so as to carry out opening and shutting operations for grasping components from different directions for carrying the components; means for opening and closing said position regulating pawls to grasp or release the component being handled; and a pair of electrodes which are provided on at least one pair of position regulating pawls and which are adapted to detect the presence of the component in the position regulating pawls when said position regulating pawls have been closed.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a cross-sectional view of the tip of a suction tool in a conventional apparatus, as described above;

FIG. 2 is a perspective view of an essential portion of the apparatus for carrying and placing components, according to one embodiment of the present invention;

FIG. 6 is a bottom view taken from the direction of the line B—B in FIG. 3;

FIG. 7 is a view similar to FIG. 4, showing the condition in which the position regulating pawls are open;

FIG. 8 is a view similar to FIG. 6, showing the pawls in the same condition as in FIG. 7.

DETAILED DESCRIPTION OF THE INVENTION

Figure 3:
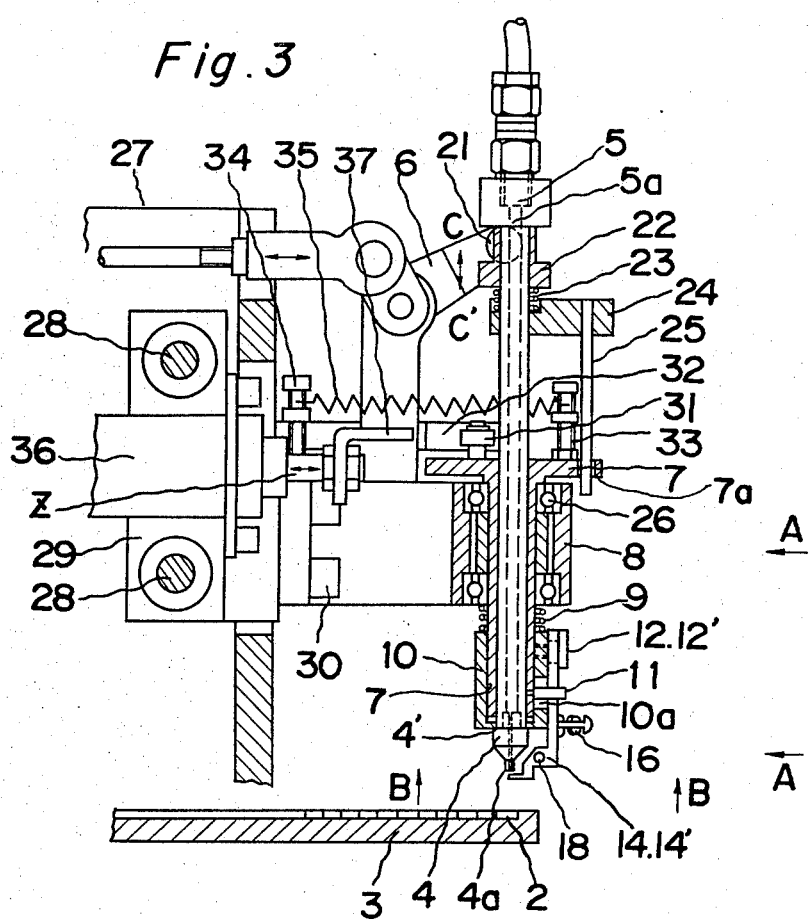
FIG. 3 is a cross-sectional view, on an enlarged scale, of the apparatus of FIG. 2.

Before the description of the present invention proceeds, it is to be noted that like parts are designated by the same reference numerals throughout the drawings.

Referring to FIG. 2, the tip components 2 are arranged in a row within an oscillating chute 3, are picked up one-by-one by suction tool 4 from the front end of the chute 3 and are carried to predetermined locations by the suction tool 4.

Referring to FIG. 3, the suction tool 4 is coupled to a rod 5. The rod 5 and the suction tool 4 are shiftable in a vertical direction so as to perform their vertical movement on supporting members including roller 21, sliding ring 22, compression spring 23 and lever 24 secured to the rod 5, said vertical movements thereof being caused by swinging of a lever 6 carrying the roller 21 on application of external force to the lever. The roller 21 does not interfere with the rotation of the sliding ring 22 around the rod 5 and is engaged to move together with the sliding ring 22 in the axial direction of the rod 5. The compression spring 23 is provided between the sliding ring 22 and the lever 24 to provide a given value of the force of the suction tool 4 against a tip component 2. The rod 5 and the suction tool 4 are provided, respectively, with air suction holes 5a and 4a which are connected with each other for applying a vacuum to the tip components 2 at the lower end of the suction tool 4. The hole 5a is connected at the upper end to a vacuum apparatus. The rod 5 is vertically slidably supported by a rotary base 27. A guide rod 25 which is mounted on the lever 24 secured to the rod 5 is slidably engaged within a vertical hole 7a in a rotary boss 7 to prevent rotation of the rod 5 relative to the rotary boss 7. The rotary boss 7 is rotatably mounted in bearings 26 in a moving block 8 which is movable horizontally by an external means. The moving block 8 is mounted, by a bolt 30, on a sliding block 29, which is slidable along two guide rods 28 and 28' secured to the body frame 27.

A mechanism for rotating the rod 5 90° will be described hereinafter with reference to FIGS. 2 and 3. A roller 31 is mounted on the rotary boss 7 and is normally urged by an urging means into contact with a cam 32 secured to the body frame 27. The urging means is constituted by a tension spring 35 provided between a pin 33 secured to the rotary boss 7 and a pin 34 secured to the moving block 8. The 90° rotation of the rotary boss 7 is carried out by the action of the cam 32 normally engaged by the roller 31 under the action of the urging means during the horizontal movement of the moving block 8 for a given distance. A releasing mechanism for the rod 5 includes a metal stop 37 which is mounted on the tip end of an air cylinder 36 secured to the sliding block 29. The metal stop 37 can be moved in the direction of the arrow Z in FIG. 3 by the operation of the air cylinder 36. When it is desired to release the rod 5 from the position in which it is rotated 90°, the metal stop 37 is advanced by the operation of the air cylinder 36 and is pressed against the rotary boss 7 to move the boss 7 against the urging force of the tension spring 35, thereby to release the roller 31 from the cam 32.

A position regulating mechanism which is operated as the suction rod is moved along the path which the tip components are carried will be described hereinafter. A sliding boss 10 is supported, through a compression spring 9 provided below the lower bearing 26 in the rotary boss 7, on the suction tool 4 and is slidable in the vertical direction along the rotary boss 7. Guide pins 11 and 11' secured on the rotary boss 7 at position 90° apart are slidably engaged in slots 10a and 10a' provided in the sliding boss 10, with the result that the sliding boss 10 rotates together with the rotary boss 7 due to the engagement of the guide pins 11 and 11' with the sliding boss 10 and is movable in the axial direction of the rotary boss 7 with the guide pins 11 and 11' sliding within the slots 10a and 10a'.

Support shafts 12 and 12' are mounted on one side of the sliding boss 10, and position regulating pawls 14 and 14' are rotatably supported, respectively, on the supporting point shafts 12 and 12'. In FIG. 3, the suction tool 4 is in its raised position, and the upper shoulder 4' of the suction tool 4 pushes the sliding boss 10 up and the position regulating pawls 14 and 14' are closed and contact each other for regulating the position of the component, as shown in FIGS. 4 and 5.

The construction of the position regulation mechanism will be described hereinafter in detail with reference to FIG. 4 to FIG. 8. Referring to these views, the supporting shafts 12 and 13, and 12' and 13' are mounted on the two sides, i.e., the front and side elevational faces of the sliding boss 10, the two sides being adjacent and normal to each other. The position regulating pawls 14 and 14', and 15 and 15', which have gear teeth thereon respectively engaged with corresponding teeth on adjacent pawls, are rotatably mounted for rotation in opposite directions on these supporting shafts 12 and 13, and 12' and 13', the free end portions of the position regulating pawls 14 and 14' being opposed to each other, in the horizontal direction in FIG. 6, while the free end portions of the position regulating pawls 15 and 15' are opposed to each other, in the vertical direction in FIG. 6. Tension springs 16 and 17 are mounted, respectively, between the position regulating pawls 14 and 14', and between the position regulating pawls 15 and 15', and urge the pawls in the direction to contact with each other. FIG. 4 to FIG. 6 show, respectively, one state in which the position regulating pawls 14 and 14' and 15 and 15' are kept closed by the urging force of tension springs 16 and 17 to engage the free end portions thereof with the four corners of the tip component 2 picked up by the suction tool 4 in order to grasp the tip component 2 by engaging the four edges of the tip component 2, while FIG. 7 and FIG. 8 show, respectively, the other state in which the position regulating pawls 14 and 14' and 15 and 15' are held opened against the urging forces of tension springs 16 and 17 to free the end portions thereof from the tip component 2 picked up by the suction tool 4 in order to release the tip component 2 from the position regulating pawls 14 and 14' and 15 and 15'. Referring to these views, as the suction tool 4 descends due to the clockwise rotation of the lever 6, the sliding boss 10 descends with the suction tool 4, the upper shoulder 4' of the suction tool 4 being in contact with the underside of the sliding boss 10, until the top portion of the slot 10a comes into contact with the guide pin 11. At this time, the guide pin 11 secured to the rotary boss 7 engages cam surfaces 14a on the position regulating pawls 14 and 14' to separate them from each other against the urging force of the tension spring 16, as shown in FIG. 7. Likewise, the position regulating pawls 15 and 15' separated from each other by the guide pin 11' disposed between the position regulating pawls 15 and 15' against the urging force of the tension spring 17. The tip component 2 picked up by the suction tool 4 is thus not engaged by the position regulating pawls 14 and 14' and 15 and 15' when it is picked up.

Figure 4:
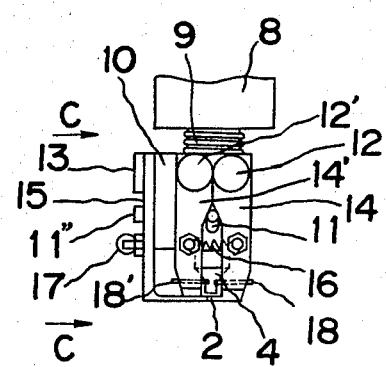
FIG. 4 is a side-elevational view of a portion of the apparatus of FIG. 3 and taken from the direction of the line A—A in FIG. 3.
Figure 5:
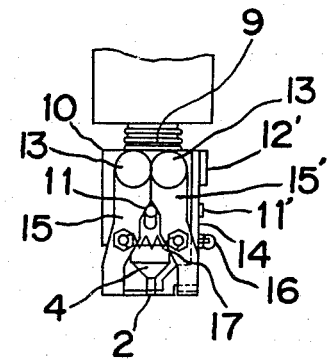
FIG. 5 is a front-elevational view taken from the direction of the line C—C in FIG. 4.

Detecting electrodes 18 and 18' are provided, respectively, on the position regulating pawls 14 and 14', as shown in FIG. 4. When the tip component 2 picked up by the suction tool 4 is between the detecting electrodes 18 and 18', the amount of movement of the position regulating pawls 14 and 14' in closing increases due to the rotation of the position regulating pawls 14 and 14' until the opposed ends of the electrodes 18 and 18' are brought into contact with each other through the tip component 2 and are energized to detect the existence of the tip component 2 by means of an external circuit, not shown, connected with the detecting electrodes 18 and 18'.

The operation will be described hereinafter with reference to FIGS. 9(a), (b), (c) and (d). Referring to these views, only two directions from among four position regulating directions with respect to the position regulating pawls 14 and 14' and 15 and 15' will be considered for easier understanding.

Referring to FIG. 9(a), the tip components 2 are delivered in a row by the vibrating chute 3. Firstly, the position regulating pawls 14 and 14' are open when the suction tool 4 engages the tip component. Then, as seen in FIG. 9(b) the tip component 2 is picked up by the suction tool 4 and, at this time, the position regulating pawls 14 and 14' are kept open. In FIG. 9(c), the position regulating pawl 14 and 14' are closed, while the suction tool 4 carries the tip component 2 from the vibrating chute 3 to a given position on the engaging board 19, to regulate the position of the tip component. In FIG. 9(d), the position regulating pawls 14 and 14' are opened as the suction tool 4 descends, thereby to release the tip component 2 as it is placed on the board 19 by the suction tool.

Figure 9:
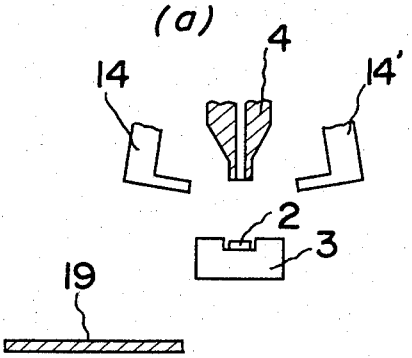
FIGS. 9(a), (b), (c) and (d) are schematic views illustrating how the positions of a tip component are regulated according to the present invention.
Figure 9:
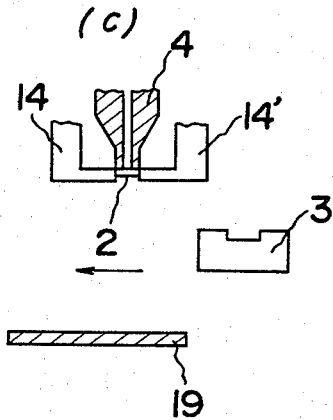
Figure 9:
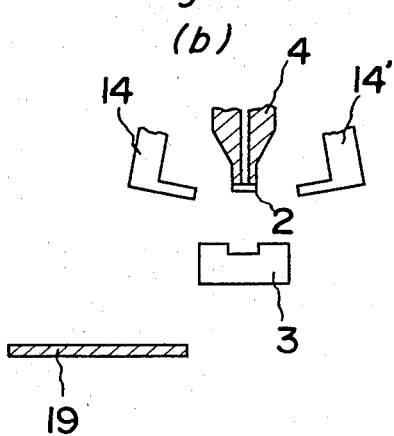
Figure 9:
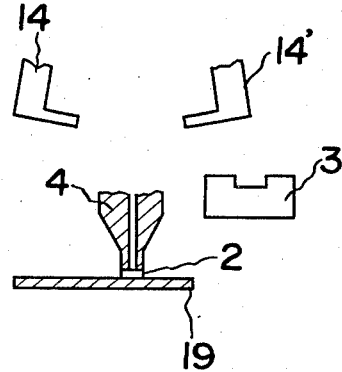

The operation of the apparatus of the present invention will be described hereinafter in detail with reference to FIG. 3 to FIG. 9. In the condition shown in FIG. 3 which corresponds to that of FIG. 9(a), when the lever 6 is turned in the direction of arrow C' by an external means such as a cylinder (not shown), the sliding ring 22 is moved downwardly by the roller 21 and the force transmitted through the compression spring 23 and lever 24 moves the rod 5 downwardly corresponding to the movement of the lever 6. The suction tool 4 descends with the rod 5 and comes into contact with the tip component 2 held in and delivered by the vibrating chute 3, and the suction force of the suction means is applied through the suction holes 5a and 4a to suck one tip component 2 against the bottom of the suction tool 4. Also, the sliding boss 10 is pushed downwardly by the resilient force of the spring 9 to open the position regulating pawls 14 and 14' and 15 and 15' against the resilient force of the springs 16 and 17 by forcing the cam surfaces thereon against guide pins 11 and 11', as shown in FIG. 7. After picking up the one tip component 2 with the suction tool 4, the lever 6 is turned in the direction of arrow C and the suction tool 4 rises, along with the rod 5, lever 24, spring 23 and ring 22 carrying one tip component 2 held thereon by suction. The upper shoulder 4' of the suction tool 4 comes in contact with the underside of the sliding boss 10 as shown in FIG. 9(b). When the lever 6 is turned further in the direction of arrow C the boss 10 is blocked against the resilient force of the spring 9, the suction tool 4 ascends through the rod 5 and the upper shoulder portion 4' of the suction tool 4 contacts the sliding boss 10 and pushes the sliding boss 10 upwardly. At this time, the compression spring 9 is compressed and the sliding boss 10 rises and the position regulating pawls 14 and 14' and 15 and 15' are closed by the springs 16 and 17, since the pawls move up past the guide pins 11 and 11'. Thus, the free ends of the position regulating pawls 14 and 14' and 15 and 15' provided on the two side-faces of the sliding boss 10 which are perpendicular are brought together and engage the tip component 2. The presence of the component is detected by the detecting electrodes 18 and 18' which contact the tip component 2. By this action the transfer of the tip component 2 can be smoothly performed, since the tip component is moved together with the suction tool 4 in the sliding direction of the rod 5 which is parallel to the direction of the suction exerted on the tip component by the suction tool 4 and is perpendicular to the direction of movement of the moving block 8. FIG. 9(c) shows the moving block 8 being moved in the transverse direction along the guide rods 28 and 28' by the external means with the position of the tip component 2 being regulated, so that the tip component picked up by the suction tool 4 and positioned by the position regulating pawls 14 and 14' and 15 and 15' is placed in proper orientation at a desired position. Then the lever 6 again turns in the direction C', the rod 5 and the suction tool 4 descend and the upper shoulder 4' of the sucking tool 4 separates from the sliding boss 10 and the position regulating pawls 14 and 14' and 15 and 15' again open. As the upper shoulder 4' separates from the sliding boss 10, the sliding boss 10 is lowered due to the urging force of the compression spring 9 and the guide pins 11 and 11' are engaged by the cam faces on the position regulating pawls 14 and 14' and 15 and 15' to open them. The boss 10 slides further along the guide pins 11 and 11' and thereafter comes to stop. The suction tool 4 descends further due to the turning operation of the lever 6, so that only the suction tool 4 reaches the board 19 to place the tip component 2 on the board 19. FIG. 9(d) shows this condition. This is the end of one component transfer cycle of the apparatus.

The apparatus of the present invention has advantages in that the positions of the tip components can be properly regulated during the picking up, carrying and placing operations of the apparatus, the existence of the components can be detected by the operation of the position regulating pawls, and a vacuum sensor, photosensor, etc. are not required.

In addition, the present invention contemplates the use of different shapes of the position regulating pawls, and some modifications in the construction of the opening and closing means for the position regulating pawls and the tip component moving means for the moving block.

Although the present invention has been described and illustrated in detail, it is to be clearly understood that the same is by way of limitation, the spirit and scope of the present invention being limited only by the terms of the appended claims.

What is claimed is:

1. An apparatus for carrying and placing components, comprising:
   a body frame fixed at a position;
   a rod means movably supported on said body frame for movement in the vertical and horizontal directions;
   a moving means connected to said rod means for moving said rod means in the horizontal direction;
   a further moving means connected to said rod means for moving said rod means in the vertical direction;
   a suction tool on the lower end of said rod means for picking up a component;
   suction means connected to said suction tool for supplying a vacuum to said suction tool when the suction tool is carrying a component;
   at least one pair of positioning pawls rotatably mounted on said rod means and having free ends for grasping and positioning a component therebetween when the free ends are moved toward each other; and
   a means for rotating said positioning pawls in synchronization with the movement of said rod means and having a first spring connected between the pawls in each pair and urging the free ends of said pawls toward each other, a pawl supporting member slidable on said rod means, a second spring engaging said pawl supporting member and urging the pawl supporting members and pawls along said rod means in the axial direction thereof toward said suction tool, and at least one pin on said rod means and engaged by said pawls as said pawls move toward said suction tool for urging said pawls apart to move the free ends away from each other against the action of said first spring, whereby said pawls have the free ends apart when the suction tool on the rod means is in the lowered position for picking up or positioning a component, and when said rod means is moved to the raised position, said free ends are moved together by said first spring for engaging the free ends with a component picked up by said suction tool from opposite directions for properly positioning the component on said suction tool.

2. An apparatus as claimed in claim 1 wherein there are two pairs of positioning pawls each rotatably mounted on said rod means and movable in directions for moving the free ends into engagement with a component held by said suction tool from different directions.

3. An apparatus as claimed in claim 2 wherein the respective pairs of pawls are mounted on said rod means for rotation around axes which are perpendicular to each other.

4. An apparatus as claimed in claim 1 further comprising a pair of electrodes, one on each of the positioning pawls, for detecting the presence of a component between said pawls by engagement of said electrodes with a component engaged by said pawls.

* * * * *